(12) United States Patent
Schuegraf

(10) Patent No.: US 6,355,549 B1
(45) Date of Patent: Mar. 12, 2002

(54) METHOD OF FORMING POLYCIDE STRUCTURES

(75) Inventor: Klaus Florian Schuegraf, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/688,259

(22) Filed: Oct. 13, 2000

Related U.S. Application Data

(62) Division of application No. 08/911,840, filed on Aug. 15, 1997, now Pat. No. 6,156,632.

(51) Int. Cl.$^7$ ................. H01L 21/3205; H01L 21/4763
(52) U.S. Cl. ........................................ 438/592; 438/639
(58) Field of Search ............................... 438/586, 592, 438/626, 706, 453, 639, 663, 683, 710, 721, 749, 755

(56) References Cited

U.S. PATENT DOCUMENTS

| | | | |
|---|---|---|---|
| 5,047,367 A | 9/1991 | Wei et al. | 437/200 |
| 5,162,259 A | 11/1992 | Kolar et al. | 437/192 |
| 5,198,382 A | 3/1993 | Campbell et al. | 437/46 |
| 5,302,552 A | 4/1994 | Duchateau et al. | 437/200 |
| 5,334,545 A | 8/1994 | Caviglia | 438/592 |
| 5,356,837 A | 10/1994 | Geiss et al. | 437/200 |
| 5,482,895 A | * 1/1996 | Hayashi et al. | 438/639 |
| 5,484,743 A | 1/1996 | Ko et al. | 438/29 |
| 5,677,217 A | 10/1997 | Tseng | 438/651 |
| 5,686,321 A | 11/1997 | Ko et al. | 438/305 |
| 5,811,339 A | 9/1998 | Tseng | 438/289 |
| 6,074,960 A | * 6/2000 | Lee et al. | 438/749 |

OTHER PUBLICATIONS

A.J. Atanos et al., "New Method for the Formation and Anneal of Cobalt Silicide", *4$^{th}$ Int. Conf. on Advanced Thermal Processing of Semiconductors –RTP 96*, pp. 389–394 (1996).

Q.F. Wang et al., "RTP Cobalt Salicidation As a Solution for 0.25 $\mu$m CMOS and Beyond", *4$^{th}$ Int. Conf. on Advanced Thermal Processing of Semiconductors—RTP '96*, pp. 395–399 (1996).

* cited by examiner

*Primary Examiner*—David Nelms
*Assistant Examiner*—Phuc T. Dang
(74) *Attorney, Agent, or Firm*—Mueting, Raasch & Gebhardt, P.A.

(57) ABSTRACT

A method of forming a polycide structure in accordance with the present invention includes forming a polysilicon layer on a surface. A refractory metal silicide portion of the polycide structure is formed on the polysilicon layer and the polysilicon portion of the polycide line is formed after formation of the metal silicide portion. The formation of the metal silicide portion of the polycide structure may include forming an oxide hard mask over the polysilicon layer exposing line portions of the polysilicon layer. The exposed line portions of the polysilicon layer are silicided resulting in a refractory metal silicide portion and unreacted material over the oxide hard mask. The unreacted material and oxide hard mask are then removed. The refractory metal silicide portion may be formed by forming a refractory metal or metal silicide layer, such as cobalt or cobalt silicide, over the oxide hard mask and exposed portions of the polysilicon layer. The refractory metal or metal silicide layer is then reacted with the polysilicon layer resulting in the refractory metal silicide portion of the polycide structure. Another method includes forming a polycide structure by using a refractory metal silicide portion of the polycide structure as a hard mask to remove portions of an underlying layer of polysilicon to form the polysilicon portion of the polycide structure. The polycide structure may be a polycide bit line, word line, interconnect or any other polycide structure.

11 Claims, 7 Drawing Sheets

METHOD OF FORMING POLYCIDE STRUCTURES

This is a division of application Ser. No. 08/911,840, filed Aug. 15, 1997, now U.S. Pat. No. 6,156,632, which is incorporated herein by reference.

FIELD OF THE INVENTION

The present invention relates to methods of manufacturing semiconductor devices. In particular, the present invention pertains to methods of forming polycide structures in the fabrication of semiconductor devices.

BACKGROUND OF THE INVENTION

As line widths of semiconductor devices decreases, desire for low resistance polycides with low aspect ratios has led to the consideration of various polycide materials other than the conventional tungsten or titanium silicide. For example, such polycide materials may include cobalt silicide, tungsten nitride, and other refractory metal suicides. To use such materials, effective methods for forming polycide structures must be developed.

Cobalt silicide, in particular, due to its low bulk resistivity and small grain size, allows for low resistivity to be preserved for fine line widths of polycide structures. However, cobalt silicide is a difficult material to volatilize and thus dry etch or remove when patterned. As such, the use of different refractory metal silicides for forming polycide structures, in particular, cobalt silicide, has been focused on its use in the salicide process where both transistor gate and source/drain diffusion regions in the active area of devices, such as memory devices, are simultaneously silicided, such as shown in the prior art figures of FIG. 1A and FIG. 1B.

As shown in FIG. 1A and FIG. 1B, field oxide regions 17, gate region 12 including spacers 16, gate oxide 14, and polysilicon 18, and also source and drain regions 22, 24, are formed on substrate 10. A layer of refractory metal, for example cobalt, is deposited such as by sputtering on these previously fabricated regions.

The structure being fabricated is then heated to a temperature at which the refractory metal forms metal silicide regions 26, 28, and 30 in the source region 22, drain region 24, and with polysilicon 18 of gate region 12, respectively. Thus polycide line 13, i.e., a word line including a polysilicon portion 18 and a metal silicided portion 30, is formed. However, metal silicide is not formed over the oxide regions, such as spacers 16 and field oxide regions 17. The unreacted refractory metal 20 over such oxide regions, such as spacers 16 and field oxide regions 17, is then removed. An insulating layer 32 is formed over the structure with a contact hole being formed for connection of a contact 34 to the metal silicide region 30 of polycide word line 13.

However, in many circumstances, such as in the fabrication of dynamic random access memories, it is undesirable to silicide the source region 22 and drain region 24. Such undesirability is due to decreased line widths as it is difficult to accommodate such salicided source and drain regions in processes which require minimal gate junction/channel leakage. Such leakage may occur due to source and/or drain diffusion into the junction/channel region of the gate.

A conventional process flow for patterning a polycide line without saliciding the drain or source regions is shown in the prior art FIGS. 2A–2D. FIG. 2A shows a structure including field oxide regions 42 and gate oxide region 44 isolated in the active area therebetween. As shown in FIG. 2B, a polysilicon layer 46 is formed over the field oxide regions 42 and gate oxide 44 followed by a layer of refractory metal 48, such as cobalt. After the structure, including the polysilicon layer 46 and refractory metal layer 48, is annealed to form metal silicide layer 47 (FIG. 2C), such as cobalt silicide, the polycide line 51 (FIG. 2D), i.e., word line, is patterned using photoresist 50. The cobalt silicide or metal silicide layer 47 and polysilicon layer 46 are then etched to form the polycide word line 51 including metal silicide region 52 and polysilicon region 53. Thereafter, spacers may be formed at the walls of the polycide word line. Gate oxide 44 may be etched to form gate oxide region 45 and various implants performed to provide drain and source regions 54 and 56 of the structure as shown in FIG. 2D. However, the refractory metal reacts with all of the polysilicon layer 46 and not just at the region where the polycide structure is to be formed. As it is difficult to etch some refractory metal silicides, such as, for example, cobalt silicide, due to difficulty of volatilizing and thus dry etching the silicide, this conventional process is problematic.

Accordingly, there is a need in the art for forming polycide structures, such as lines, and in particular, polycide structures utilizing cobalt silicide, which overcomes the difficulty in etching the refractory metal silicide in the formation process. Such a polycide structure formation process should be usable in various processes such as in the formation of a polycide word line or bit line with no need to salicide the drain and source regions of devices being fabricated. The present invention overcomes the problems as described above and overcomes other problems as will become apparent to one skilled in the art from the description below.

SUMMARY OF THE INVENTION

A method of forming a polycide structure in accordance with the present invention includes forming a polysilicon layer on a surface. An oxide hard mask is formed over the polysilicon layer exposing portions of the polysilicon layer and resulting in unexposed portions of the polysilicon layer. A layer comprising refractory metal material is formed over the oxide hard mask and the exposed portions of the polysilicon layer. The layer comprising the refractory metal material and the polysilicon layer are annealed resulting in a refractory metal silicide region of the polycide structure and unreacted refractory metal containing material over the oxide hard mask. The unreacted refractory metal material and oxide hard mask are removed. The unexposed portions of the polysilicon layer are also removed resulting in a polysilicon region of the polycide structure.

In various embodiments of the method, the layer comprising the refractory metal material is cobalt or cobalt silicide. In another embodiment of the method, the removal of the unreacted metal containing material is substantially decoupled from the removal of the unexposed portions of the polysilicon layer.

Another method of forming a polycide line in accordance with the present invention is described. A polysilicon layer is formed on a surface. A refractory metal silicide portion of the polycide line is formed on the polysilicon layer. A polysilicon portion of the polycide line is formed after formation of the metal silicide portion.

In one embodiment of the method, the formation of the metal silicide portion of the polycide line includes forming an oxide hard mask over the polysilicon layer exposing line portions of the polysilicon layer. The exposed line portions of the polysilicon layer are silicided resulting in a refractory metal silicide line portion and unreacted material over the oxide hard mask. The unreacted material and oxide hard mask are then removed.

In another embodiment of the method, siliciding of the exposed line portions of the polysilicon layer include forming a refractory metal or metal silicide over the oxide hard mask and exposed portions of the polysilicon layer. The refractory metal or metal silicide layer is then reacted with the polysilicon layer resulting in the refractory metal silicide portion of the polycide line. In a further embodiment of the invention, the polycide line is of a width less than about 0.25 microns.

In another method of forming a polycide structure in accordance with the present invention, a refractory metal silicide portion of the polycide structure is used as a hard mask to remove portions of an underlying layer of polysilicon to define the polysilicon portion of the polycide structure.

In other methods of the present invention, polycide bit lines, polycide word lines, and polycide interconnects are formed in similar manners as described above.

DETAILED DESCRIPTION OF THE EMBODIMENTS

The formation of a polycide structure in accordance with the present invention shall be described with reference to FIGS. 3A–3F. In FIGS. 3A–3F, the formation of a polycide line 71, i.e. word line, (FIG. 3F) which includes the gate electrode of a MOS transistor shall be described. However, the general method of forming this polycide line is applicable to the formation of any polycide structure, including any type of polycide line, such as for example, whether used as a bit line, word line, or an interconnect, and the present invention of forming a polycide structure is in no manner limited to the formation of a polycide line as described with reference to FIGS. 3A–3F.

Generally, a method of forming the polycide structure includes forming a polysilicon layer and a hard mask, i.e., an oxide hard mask, thereover. The hard mask is then patterned to define the desired structure, such as the gate structure. A layer of refractory metal or refractory metal silicide is then formed over the patterned hard mask and also exposed portions of the polysilicon. The structure formed is then subjected to an annealing process which reacts the refractory metal or refractory metal silicide at the location of contact between the refractory metal material and the exposed portions of polysilicon to form the metal silicide region of the polycide structure. The unreacted refractory metal or refractory metal silicide is then removed along with the hard mask. The polysilicon portions of the polysilicon layer which were not exposed by the hard mask are then removed in a step that is decoupled from the removal of the unreacted material, i.e., unreacted refractory metal or metal silicide. Therefore, the metal silicide region of the polycide structure being formed is used as a hard mask to remove the polysilicon portions of the polysilicon layer for forming the polysilicon regions of the polycide structure.

Figure 1A:
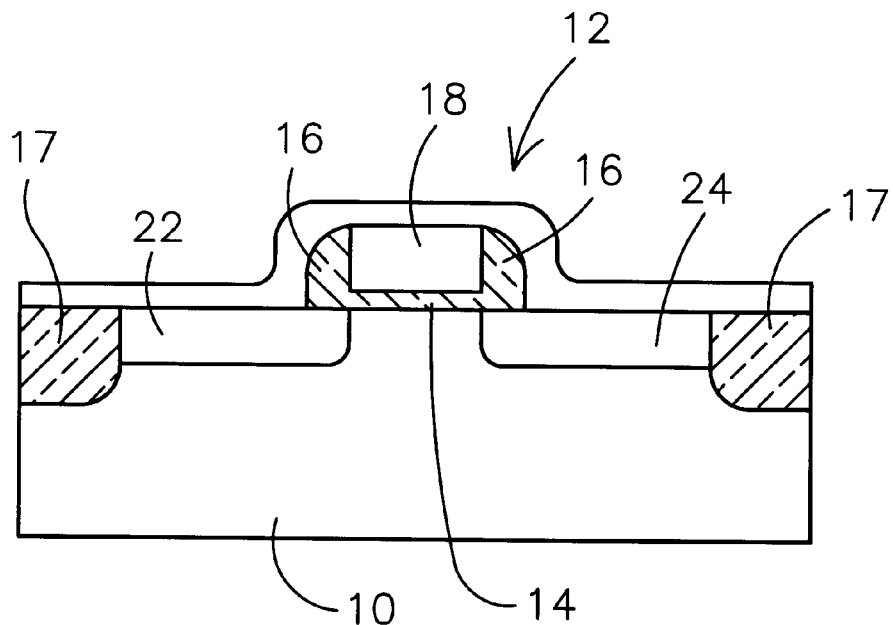
FIGS. 1A–1B and FIGS. 2A–2D illustrate prior art processing steps for use in the formation of a polycide line.
Figure 1B:
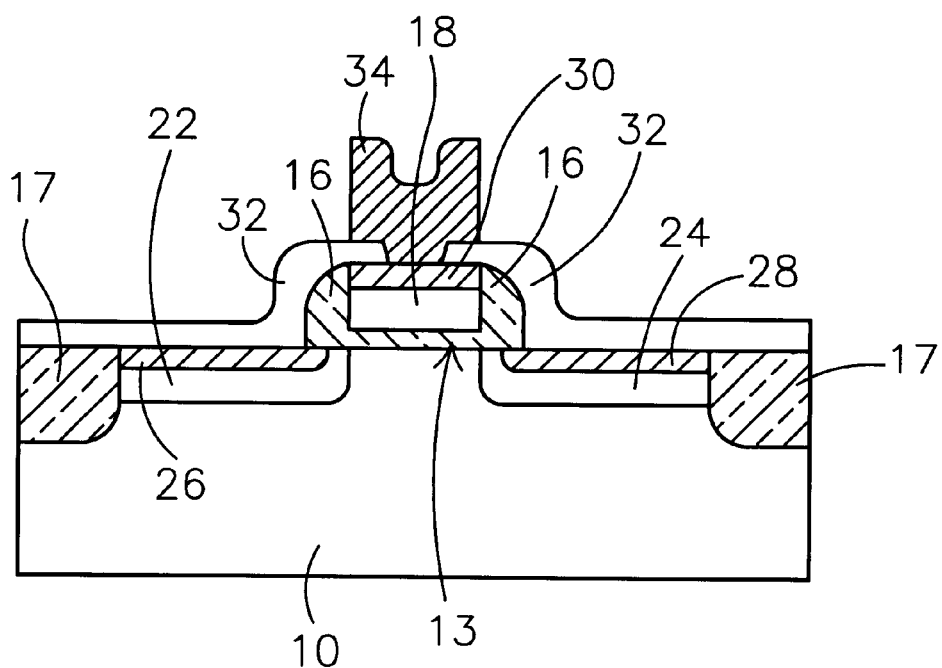
Figure 2A:
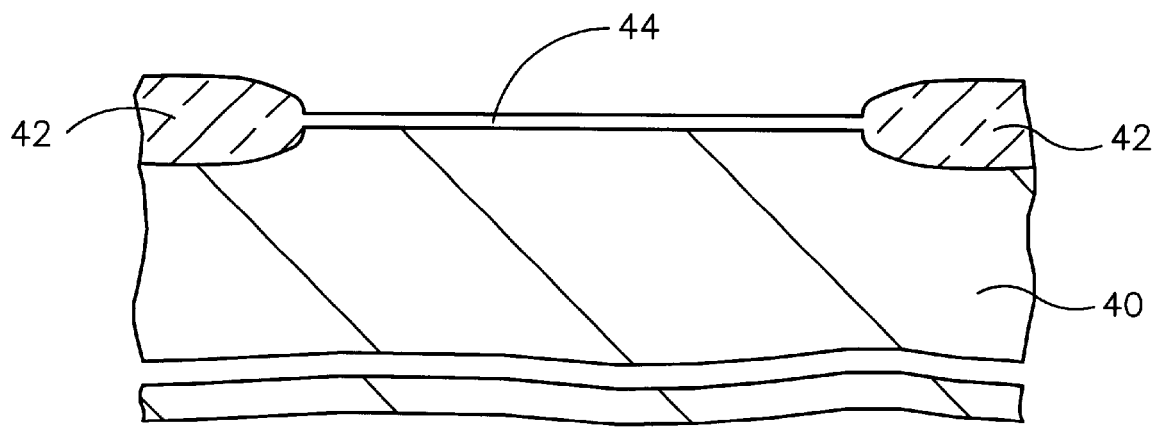
Figure 2B:
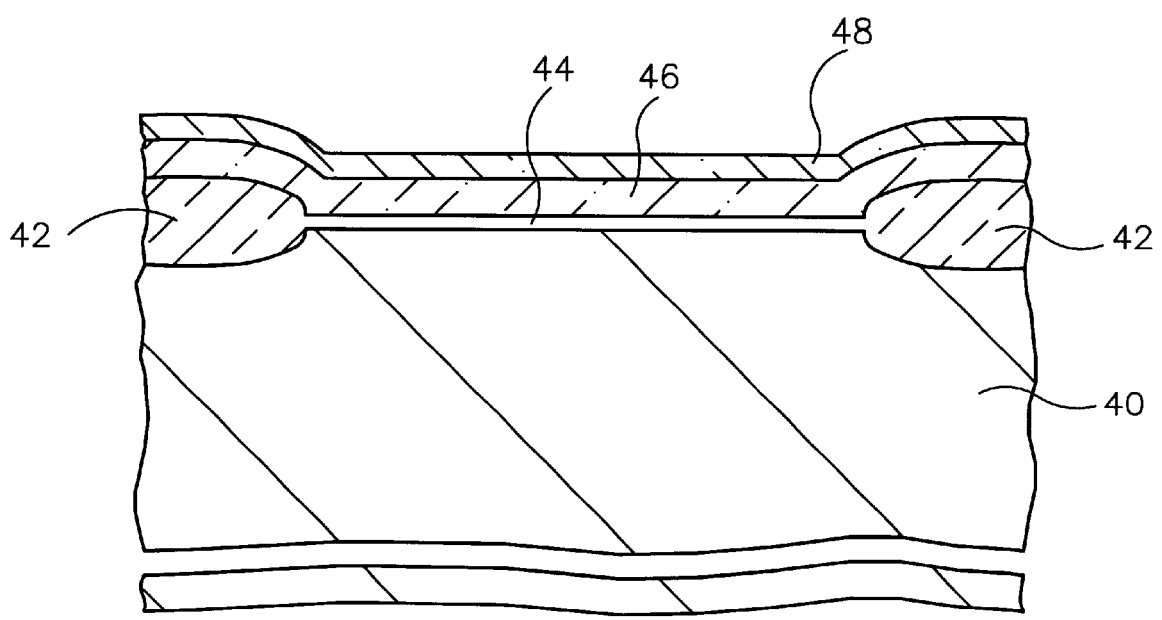
Figure 2C:
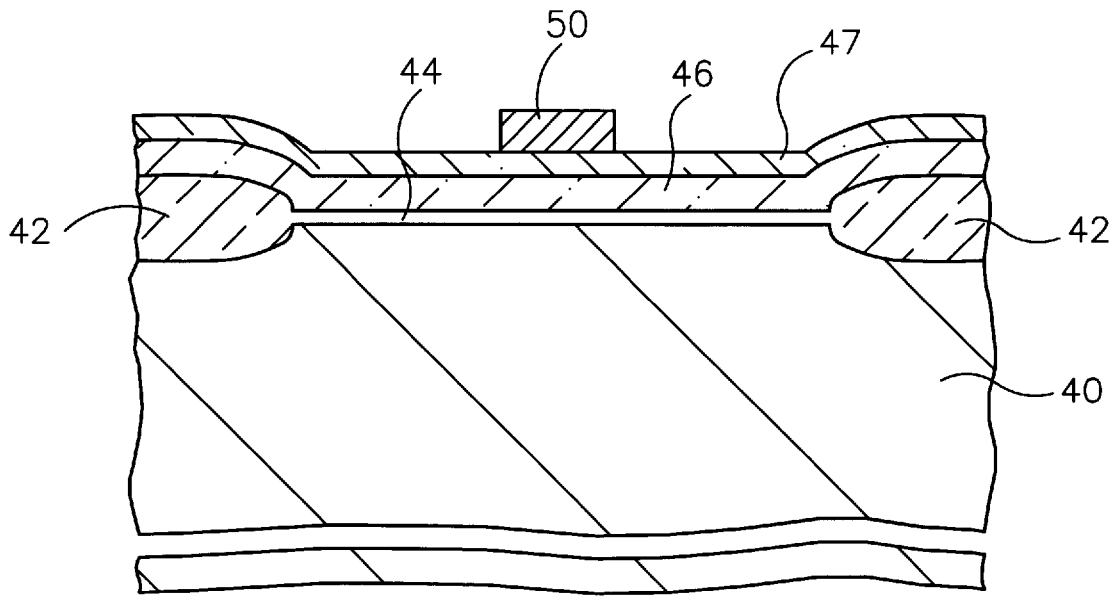
Figure 2D:
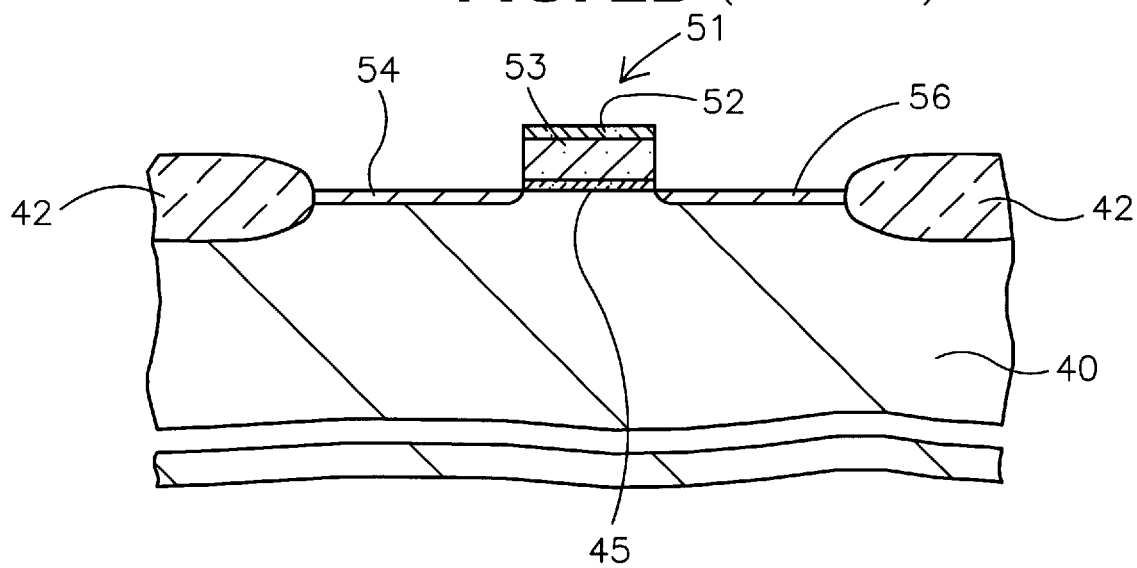
Figure 3A:
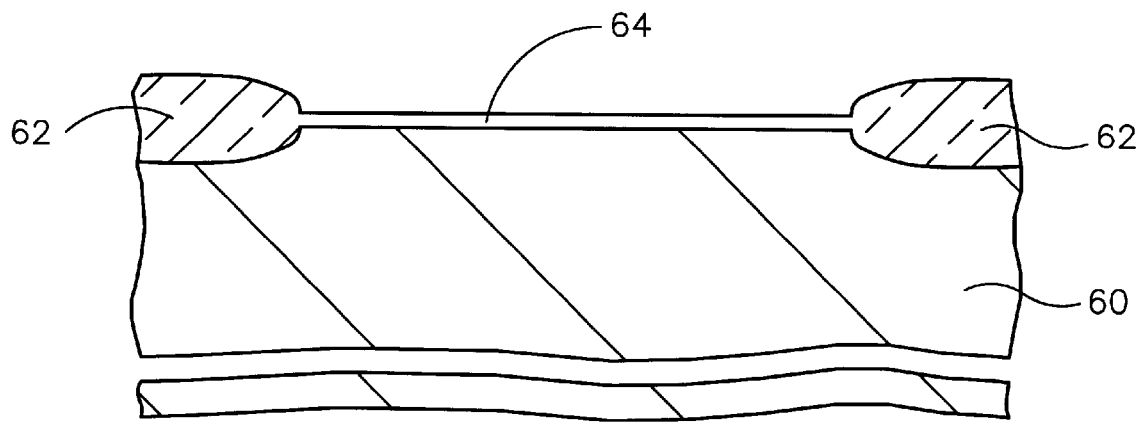
FIGS. 3A–3F show the process steps in the formation of a polycide structure, i.e. a polycide line, in accordance with the present invention.

One illustration of this general process of forming a polycide structure is shown in the formation of the polycide line 71 (FIG. 3F) on the structure shown in FIG. 3A. FIG. 3A includes field oxide regions 62 formed on substrate 60 such as, for example, by conventional local oxidation of silicon (LOCOS) processing. Further, a gate insulating layer, i.e., a gate oxide 64, is formed on semiconductor substrate 60 in the active area formed by field oxide regions 62. Semiconductor substrate 60 refers to the base semiconductor layer, e.g., a base layer of silicon material of the device or wafer or a silicon layer formed on another material such as silicon on sapphire. The polycide structure in accordance with the present invention may be formed on any semiconductor substrate or substrate assembly, wherein substrate assembly refers to a semiconductor substrate having one or more various layers formed thereon.

Figure 3B:
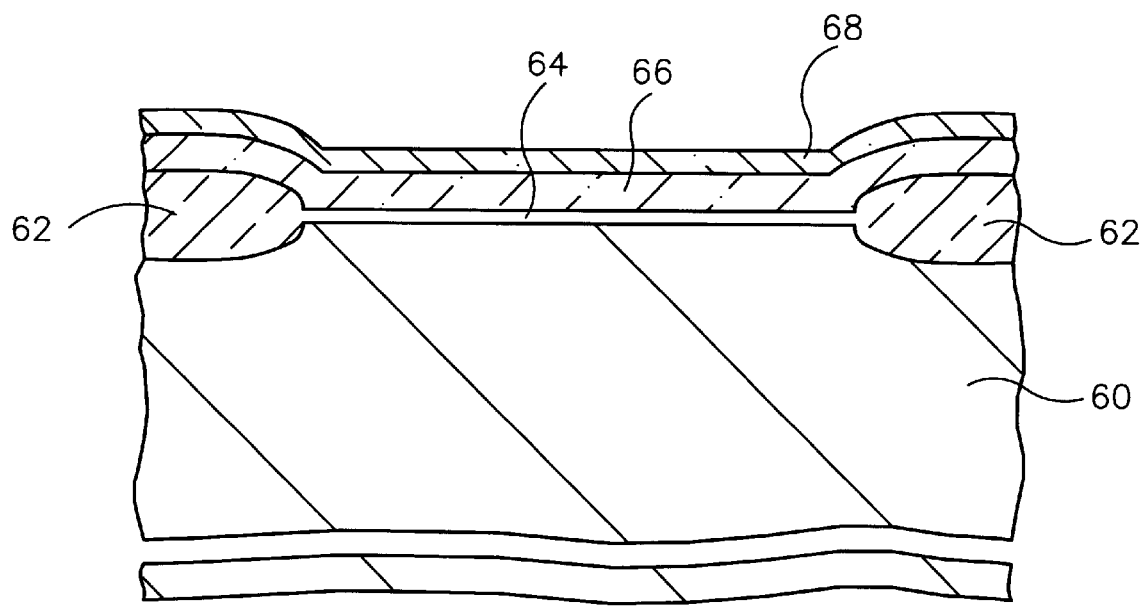
Figure 3C:
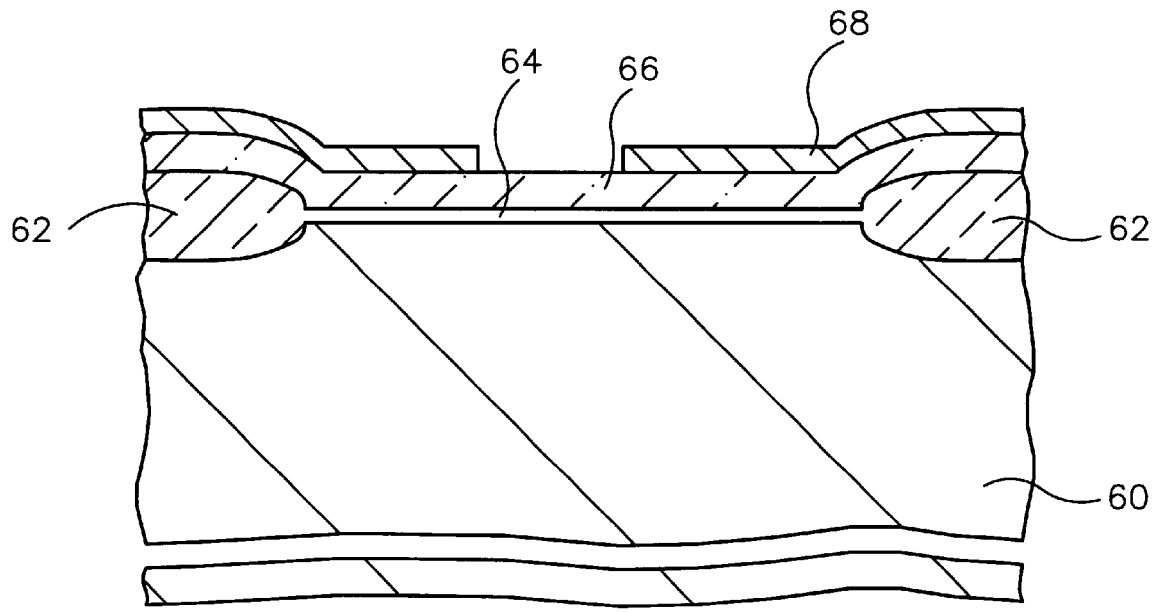

As shown in FIG. 3B, a layer of polysilicon 66 is formed over the field oxide regions 62 and gate oxide 64. The polysilicon layer 66 can be formed by any conventionally known method, such as by chemical vapor deposition or even by growth of polysilicon. For example, the polysilicon can be deposited using silicon hydrides or silanes such as dichlorosilane (DCS, $SiH_2Cl_2$), silane ($SiH_4$), disilane ($H_3SiSiH_3$), trichlorosilane (TCS, $SiHCl_3$), or any other silicon precursor known to one skilled in the art.

One illustration of the deposition of polysilicon includes the decomposition of silane at a low pressure in the range of about 0.2 torr to about 1 torr at a temperature greater than 550° C. However, the temperature and pressure will vary depending on the other parameters of the system for deposition of the polysilicon. For example, a greater pressure may require the need for a higher temperature to deposit the polysilicon. Further, the deposition of polysilicon may be accomplished by depositing silicon as an amorphous film and then recrystallizing the film to form polysilicon.

An oxide hard mask layer 68 is then formed over the polysilicon layer 66. The oxide layer 68, for example, a silicon dioxide layer, may be deposited utilizing chemical vapor deposition or may be grown. Although the oxide hard mask can be grown in an oxygen containing environment, preferably the oxide hard mask is deposited by chemical vapor deposition. For example, the silicon dioxide layer may be formed by oxidizing silane with oxygen at low pressure and low temperature, typically about 400–450° C. or by decomposing tetraethylorthosilicate, with or without oxygen at low pressure and at a temperature between about 650–750° C. Any method of depositing an oxide hard mask may be used in accordance with the present invention and in no manner is the present invention limited to the methods as listed herein. Further, the oxide hard mask may be a doped or undoped oxide layer or any other insulating layer that does not react with polysilicon or the refractive metal silicide utilized, i.e., cobalt silicide, at high temperatures to alter the essential properties of either the polysilicon or refractive metal silicide. In addition, the thickness of the hard mask is dependent upon the thickness of the refractory metal or metal silicide deposited as described below. However, the thickness of the hard mask should be sufficient to prevent the refractory material formed on the oxide from spiking through to the polysilicon layer 66 during the formation of the polycide structure being formed.

Thereafter, a resist (not shown) is utilized for patterning the word line 71, including the gate electrode, and exposing portions of the polysilicon layer 66. With the resist removed, a polysilicon region of the polycide word line is exposed as shown by the opening in the oxide hard mask layer 68 of FIG. 3C. For example, the word line may be less than 0.25 microns in width.

Figure 3D:
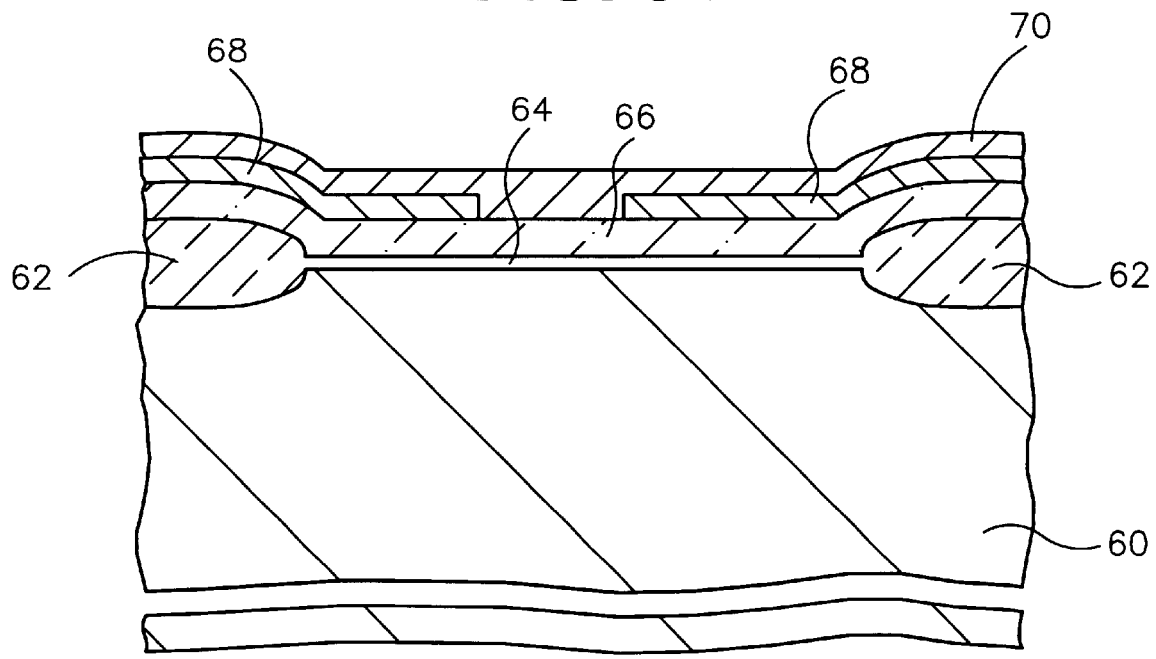

A layer 70 including a refractory metal is then formed over the patterned oxide hard mask 68 and the exposed regions of polysilicon layer 66 as shown in FIG. 3D. The layer 70 may include any refractory metal such as cobalt, nickel, titanium, zirconium, tantalum, molybdenum, niobium, tungsten, or any other refractory metal suitable for siliciding the exposed regions of the polysilicon layer 66.

In one embodiment of the invention, the layer 70 is cobalt deposited at a thickness less than about 2,000 Å. However, the thickness of the cobalt deposited depends on the desired resistance of the polycide line being formed. The cobalt layer may be deposited, for example, by sputtering, evaporation or chemical vapor deposition. For example, in a sputtering process for cobalt, the process may be performed by using an argon gas as the sputtering gas at a particular flow rate, with the application of an RF power for achieving the desired deposition in a pressurizable sputtering chamber. However, it should be readily apparent that any manner of forming the cobalt layer or refractory metal layer is contemplated in accordance with the present invention and is in no manner limited to any particular process, i.e., sputtering, for formation thereof.

The structure, as shown in FIG. 3D, is then subjected to a thermal treatment for reaction of the layer 70 which includes the refractory metal with the polysilicon layer 66 to form the refractory metal silicide portion 72 of the polycide line 71 and resulting in unreacted refractory metal over other portions of the structure, i.e., the oxide hard mask. For example, a cobalt layer may be subjected to a furnace anneal or a rapid thermal anneal. The number of anneal steps and temperatures and time periods for performing the anneal are various and may include, for example, one or more anneal steps in the temperature range of about 300° C. to 800° C. for various time periods depending upon the temperatures. The anneal forms a cobalt silicide region at the point of contact between the exposed polysilicon regions of the polysilicon film 66 and the cobalt layer deposited thereon. It should be readily apparent that the temperatures used and the duration of the thermal treatment will vary depending upon various circumstances including, but not limited to, the thickness of the various layers. Further, such parameters will vary depending upon the refractory metal utilized for the silicidation process.

In other illustrative embodiments of the present invention, the layer 70 may be a metal silicide layer, such as, for example, cobalt silicide. The metal silicide layer may be deposited to a desired thickness by, for example, the simultaneous evaporation of silicon and the refractory metal from two sources, i.e., co-evaporation; may be sputter deposited from a single composite target of the refractory metal and silicon, may be deposited by simultaneous sputtering from two targets, i.e., co-sputtering; or may be deposited by chemical vapor deposition, for example, atmospheric, low pressure, or plasma enhanced chemical vapor deposition.

For example, a cobalt silicide layer is preferably deposited by sputtering from a single target or from multiple high purity targets. The sputtered material is typically deposited at a thickness less than about 2,000 Å. However, the thickness of the layer deposited depends on the desired resistance of the polycide line being formed. The sputtering process for cobalt silicide may employ an inert gas, such as argon gas, as the sputtering gas at a particular flow rate, with the application of an RF power for achieving the desired deposition in a pressurizable sputtering chamber, typically at a pressure with a lower limit of about 2–3 mtorr. However, it should be readily apparent that such parameters are listed for illustration only and that any configuration for forming the cobalt silicide layer or refractory metal silicide layer is contemplated in accordance with the present invention and is in no manner limited to any particular process, i.e., sputtering, for formation thereof.

The structure, as shown in FIG. 3D, is then subjected to a thermal treatment for reaction of the layer 70 including the sputtered material and the polysilicon layer 66 to form the refractory metal silicide portion 72 of the polycide line 71 and resulting in unreacted refractory metal silicide over other portions of the structure, i.e., the oxide hard mask. The unreacted portions are portions which did not react with the underlying exposed portions of the polysilicon layer 66. For example, the thermal treatment may be a furnace anneal or a rapid thermal anneal. The number of anneal steps and temperatures and time periods for performing the anneal are various and may include, for example, one or more anneal steps in the temperature range of about 300° C. to 800° C. for various time periods depending upon the temperatures to anneal the sputtered material to form cobalt silicide and react portions of the cobalt silicide at the point of contact with the exposed polysilicon regions of the polysilicon film 66. It should be readily apparent that the temperatures used and the duration of the thermal treatment will vary depending upon various circumstances including, but not limited to, the thickness of the various layers. Further, such parameters will vary depending upon the refractory metal utilized for the silicidation process.

Figure 3E:
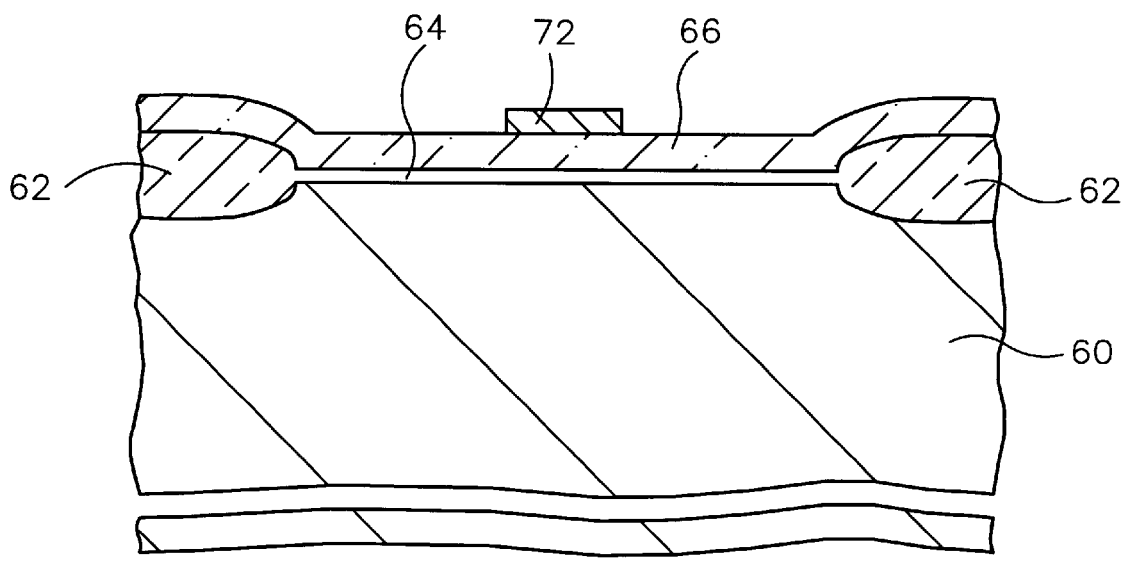

Referring to FIG. 3E, with a refractory metal silicide region 72 of the polycide word line 71 formed, the remainder of the unreacted material, i.e., either refractory metal that did not react with the exposed portions of the polysilicon layer 66 or refractory metal silicide over the oxide hard mask, and the oxide hard mask itself are removed. For example, an unreacted cobalt layer may be emerged in a mixture of hydrochloric acid and hydrogen peroxide, or in a mixture of sulfuric acid and hydrogen peroxide.

The silicon dioxide hard mask may be removed by immersion in a hydrofluoric acid solution, such as a solution buffered by ammonium hydroxide. Such removal is highly selective to the refractory metal silicide. Further, the oxide hard mask may be removed by dry etching with a fluorine containing plasma, such as $CF_4$, $SF_6$, or $NF_3$ or any other plasma which attacks the hard mask.

Figure 3F:
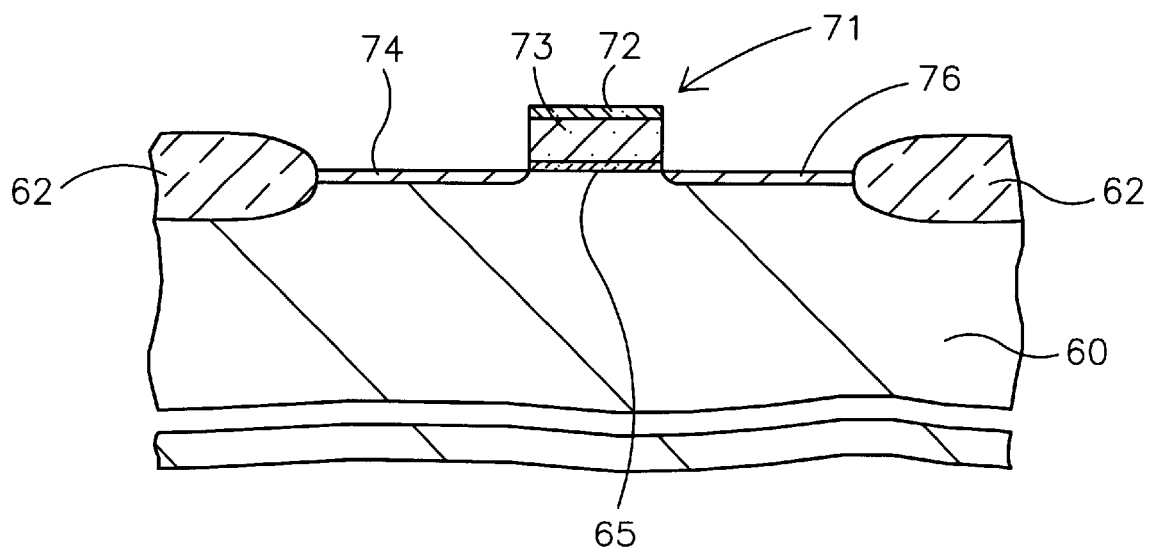

The metal silicide region 72 of the polycide word line 71 then acts as a hard mask for etching of the polysilicon layer 66 to form a polysilicon region 73 of the polycide word line 71. For example, the portions of the polysilicon layer 66 exposed, i.e., not masked by the metal silicide 72, can be dry etched with use of a fluorine or chlorine containing plasma gas, such as, for example, $CF_4$, $SF_6$, $NF_3$, $Cl_2$, or $CCl_2F_2$. The plasmas utilized must be selective to the field oxide regions 62. The removal of the exposed portions of the polysilicon layer 66 results in the completion of the polycide word line 71, as shown in FIG. 3F. The line 71 includes metal silicide region 72 and polysilicon region 73.

The removal of the portions of polysilicon for forming the polysilicon portion of the polycide structure, i.e., the word line 71, is completely decoupled from the removal of the refractory metal material of the process. This allows the formation of the polycide structure without the problems typically applicable to the conventional uses of at least cobalt silicide in the formation of polycide structures due to the difficulty of etching cobalt silicide.

The gate region 65 may then be formed by etching portions of the gate oxide layer 64 in a conventional manner. Further conventional processing may be utilized to implant source 74 and drain 76 regions of the transistor structure and further form other features of the semiconductor device having the polycide structure, such as for a memory device.

It should be readily apparent to one skilled in the art that a polycide bit line may be formed in much the same manner as the polycide word line is formed as described above. Further, the formation of the various layers, whether refractory metal, refractory metal silicide, oxide, polysilicon, or others as described above, may be formed in many different manners, with various types of apparatus, and at various parameters in the process for forming such layers. Any conventional method of forming such layers is contemplated in accordance with the present invention. For example, chemical vapor deposition of a cobalt film may be utilized as an alternative to sputtering the cobalt film. Further, a polysilicon film may be deposited as amorphous film and recrystallized, may be deposited at various temperatures suitable for depositing polysilicon, and/or may be deposited utilizing any suitable precursor conventionally utilized for polysilicon formation. Further, the silicon dioxide regions may be formed utilizing chemical vapor deposition, may be grown in an oxygen atmosphere, or may be deposited in any other conventional manner. As such, the present invention contemplates formation of the various layers described herein and removal of such layers or portions thereof in any manner as would be known to one skilled in the art and is limited only in accordance with the accompanying claims.

Figure 4A:
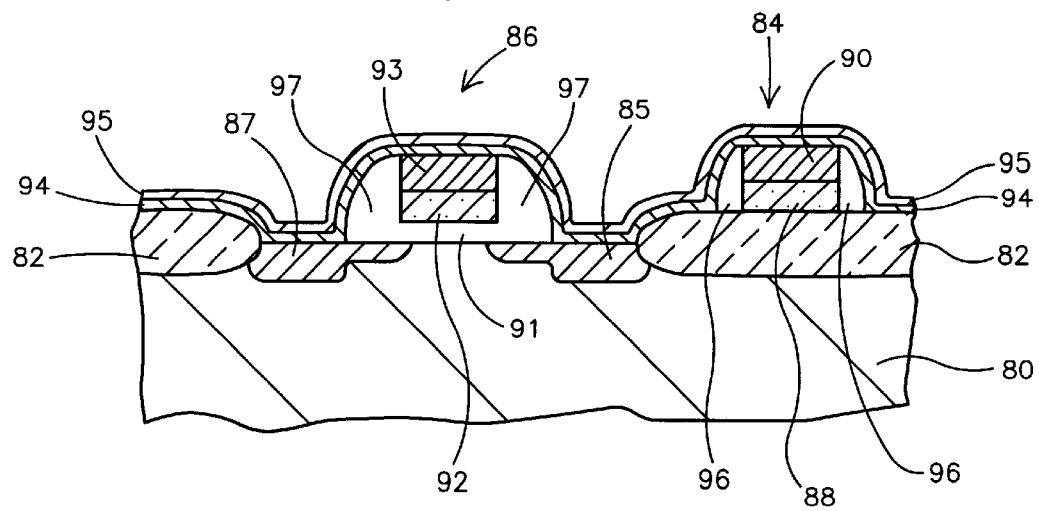
FIGS. 4A–4C generally illustrate the process steps in forming a polycide interconnect in accordance with the present invention.
Figure 4B:
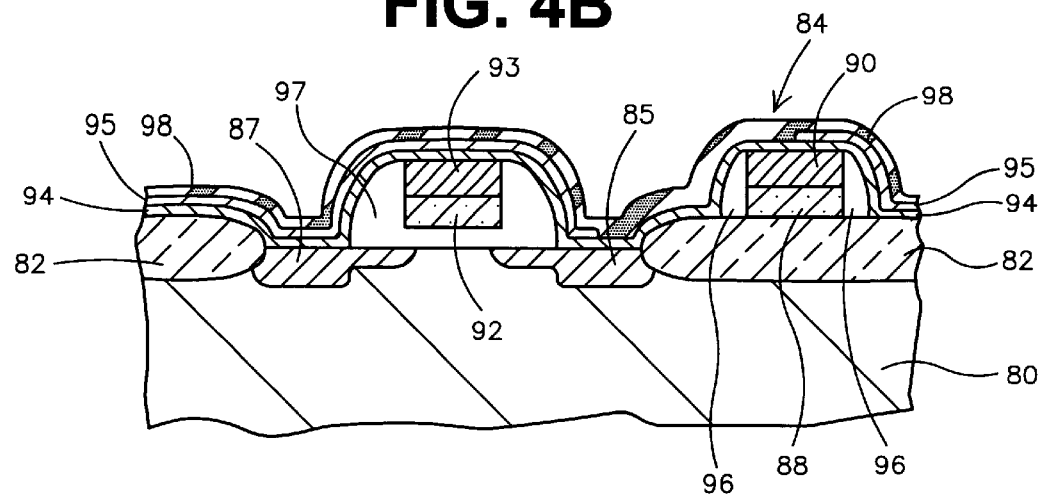
Figure 4C:
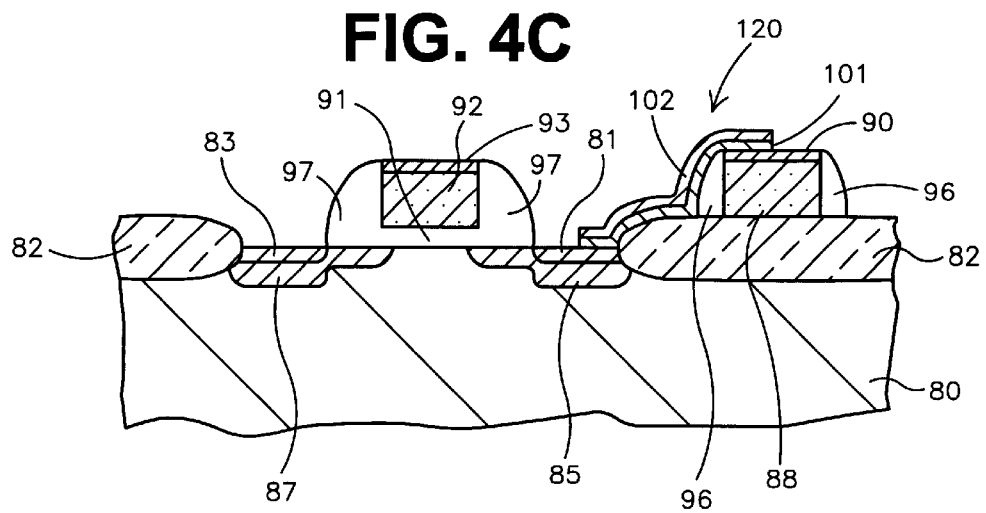

FIGS. 4A–4C is illustrative of process steps of forming a polycide interconnect in accordance with the present invention. FIG. 4A shows field oxide regions 82 formed on substrate 80 isolating an active area wherein source region 87 and drain region 85 are formed such as by implantation after formation of gate structure 86. The gate structure 86 includes polysilicon region 92 and metal silicide region 93 of the gate electrode, and further includes spacers 97 and gate oxide 91. A bit line 84 is also formed including polysilicon region 88 and metal silicide region 90 with spacers 96 formed at the sides thereof. At the surface of this particular structure, a polycide local interconnect 120 (FIG. 4C) is formed for connecting the drain 85 to the bit line 84.

As shown in FIG. 4A, a polysilicon layer 94 is formed over the various device structures. Thereafter, an oxide layer 95 is formed over the polysilicon layer 94. Resist is utilized to pattern the oxide layer 95 forming an oxide hard mask for exposing portions of the polysilicon layer 94 to be utilized for the polycide interconnect 120. A refractory metal layer or a layer for forming a metal silicide 98 is thereafter formed over the oxide hard mask 95 and the exposed regions of the polysilicon layer 94, as shown in FIG. 4B.

As previously described with reference to FIGS. 3A–3F, the structure as shown in FIG. 4B is annealed to form metal silicide particularly where the layer 98 contacts the polysilicon layer 94 to form the metal silicide region 102 of the polycide interconnect 120. The unreacted material of the layer 98 is then removed along with the oxide hard mask, such as described with reference to FIGS. 3A–3F with the metal silicide region 102 acting as a hard mask for removal of portions of the polysilicon layer 94 to form the polysilicon region 101 of the polycide interconnect. After the portions of polysilicon layer 94 are removed, the polycide local interconnect 120, including metal silicide region 102 and polysilicon region 101 connecting the drain to the bit line, is achieved.

It is readily apparent that the local interconnect can be formed to connect various elements of the structure of a device and that the present invention is in no manner limited to the illustration shown in FIGS. 4A–4C. For example, a local interconnect may be made between various regions of one or more device structures, i.e., connection of a source and drain of a pair of transistors.

The present invention has been described in connection with various embodiments. However, the invention is not limited only to the above embodiments as it is apparent to those skilled in the art that various modifications, substitutions, combinations, and the like can be made without departing from the scope of the accompanying claims.

What is claimed is:

1. A method of forming a local interconnect for a memory device, the method comprising:

selectively oxidizing the surface of a substrate to form at least one active area and field oxide regions;

forming a gate region, source region, and drain region in the at least one active area;

forming one of at least a portion of a bit line or a word line;

forming a polysilicon layer to connect at least two of the gate region, source region, drain region, bit line and word line;

forming an oxide hard mask over the polysilicon layer to define the local interconnect for connecting at least two of the gate region, source region, drain region, bit line, or word line, resulting in exposed regions of the polysilicon layer and unexposed regions of the polysilicon layer;

forming a layer comprising a refractory metal over the oxide hard mask and the exposed regions of the polysilicon layer;

reacting the layer comprising the refractory metal with the exposed regions of the polysilicon layer to form metal silicide portions of the local interconnect;

removing unreacted portions of the layer comprising the refractory metal and the oxide hard mask; and removing unexposed regions of the polysilicon layer to define a polysilicon portion of the local interconnect.

2. The method according to claim 1, wherein the layer comprising the refractory metal includes one of cobalt silicide and cobalt.

3. The method according to claim 1, wherein forming the layer comprising the refractory metal comprises forming a metal silicide layer.

4. The method according to claim 1, wherein forming the layer comprising the refractory metal comprises depositing the layer comprising the refractory metal.

5. The method according to claim 1, wherein removing unreacted portions of the layer comprising the refractory metal and the oxide hard mask is substantially decoupled from removing unexposed regions of the polysilicon layer.

6. The method according to claim 1, wherein reacting the layer comprising the refractory metal comprises annealing the layer comprising the refractory metal.

7. A method of forming an interconnect for a memory device, the method comprising:

providing a substrate having at least one active area and field oxide regions;

forming a gate region, source region, and drain region in the at least one active area;

forming one of at least a portion of a bit line or a word line;

forming a polysilicon layer to connect at least two of the gate region, source region, drain region, bit line and word line;

forming an oxide hard mask over the polysilicon layer to define the interconnect for connecting at least two of the gate region, source region, drain region, bit line, or word line, resulting in exposed regions of the polysilicon layer and unexposed regions of the polysilicon layer;

forming a metal silicide layer over the oxide hard mask and the exposed regions of the polysilicon layer;

reacting the metal silicide layer and the exposed regions of the polysilicon layer to form metal silicide portions of the interconnect over the exposed regions of the polysilicon layer;

removing both unreacted portions of the metal silicide layer over the oxide hard mask and the oxide hard mask; and removing unexposed regions of the polysilicon layer to define a polysilicon portion of the interconnect.

8. The method according to claim 7, wherein forming the metal silicide layer comprises depositing a metal silicide.

9. The method according to claim 7, wherein the metal silicide layer comprises cobalt silicide.

10. The method according to claim 7, wherein the removing both the unreacted portions of the metal silicide layer over the oxide hard mask and the oxide hard mask is substantially decoupled from removing unexposed regions of the polysilicon layer.

11. The method according to claim 7, wherein reacting the metal silicide layer comprises annealing the metal silicide layer.

* * * * *

UNITED STATES PATENT AND TRADEMARK OFFICE
CERTIFICATE OF CORRECTION

PATENT NO. : 6,355,549 B1
DATED : March 12, 2002
INVENTOR(S) : Klaus Florian Shuegraf It is certified that error appears in the above-identified patent and that said Letters Patent is hereby corrected as shown below:

<u>Title page,</u>
Item [75], Inventor, delete "Boise, ID" and insert -- Fountain Hills, AZ -- therefor.

<u>Column 1,</u>
Line 21, please delete "suicides" and insert -- silicides -- therefor.

Signed and Sealed this

Tenth Day of September, 2002

*Attest:*

*Attesting Officer*

JAMES E. ROGAN
*Director of the United States Patent and Trademark Office*